United States Patent
Allemand et al.

(10) Patent No.: US 11,642,724 B2
(45) Date of Patent: May 9, 2023

(54) DIE AND PISTON OF AN SPS APPARATUS, SPS APPARATUS COMPRISING SAME, AND METHOD OF SINTERING, DENSIFICATION OR ASSEMBLY IN AN OXIDISING ATMOSPHERE USING SAID APPARATUS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Alexandre Allemand, Bordeaux (FR); Alain Largeteau, Cestas (FR); Seu U-Chan Chung, Talence (FR); Yann Le Petitcorps, Leognan (FR); Jérôme Roger, Pessac (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/772,219

(22) PCT Filed: Nov. 3, 2016

(86) PCT No.: PCT/EP2016/076555
§ 371 (c)(1),
(2) Date: Apr. 30, 2018

(87) PCT Pub. No.: WO2017/076971
PCT Pub. Date: May 11, 2017

(65) Prior Publication Data
US 2018/0311729 A1    Nov. 1, 2018

(30) Foreign Application Priority Data
Nov. 4, 2015    (FR) ........................................ 1560561

(51) Int. Cl.
*B22F 3/105* (2006.01)
*C04B 35/111* (2006.01)
(Continued)

(52) U.S. Cl.
CPC ................ *B22F 3/105* (2013.01); *B22F 3/11* (2013.01); *B28B 3/025* (2013.01); *C04B 35/016* (2013.01);
(Continued)

(58) Field of Classification Search
None
See application file for complete search history.

(56) References Cited

U.S. PATENT DOCUMENTS 3,925,577 A * 12/1975 Fatzer ..................... C04B 35/52
427/249.16
4,582,751 A * 4/1986 Vasilos ................. C04B 41/009
427/248.1
(Continued)

FOREIGN PATENT DOCUMENTS

DE    3602634 A1    7/1987
FR    2525207 A1    10/1983
(Continued)

OTHER PUBLICATIONS

Shen et al. : Spark Plasma Sintering of Alumina: J Am. Ceram. Soc. 85 (8) p. 1921-1927, (2002).*
(Continued)

*Primary Examiner* — Mohammad M Ameen
(74) *Attorney, Agent, or Firm* — Pearne & Gordon LLP (57) ABSTRACT

A die or piston of a spark plasma sintering apparatus, wherein the die or piston is made from graphite and the outer
(Continued)

surfaces of the die or piston are coated with a silicon carbide layer with a thickness of 1 to 10 micrometres, the silicon carbide layer being further optionally coated with one or more other layer(s) made from a carbide other than silicon carbide chosen from hafnium carbide, tantalum carbide and titanium carbide, the other layer(s) each having a thickness of 1 to 10 micrometres. A spark plasma sintering (SPS) apparatus comprising the die and two of the pistons, defining a sintering, densification or assembly chamber capable of receiving a powder to be sintered, a part to be densified, or parts to be assembled. A method of sintering a powder, densifying a part, or assembling two parts by means of a method of spark plasma sintering (SPS) in an oxidising atmosphere, using the spark plasma sintering (SPS) apparatus.

8 Claims, 1 Drawing Sheet

(51) Int. Cl.

| | |
|---|---|
| *C23C 16/32* | (2006.01) |
| *C04B 35/01* | (2006.01) |
| *C04B 35/46* | (2006.01) |
| *C04B 35/468* | (2006.01) |
| *B28B 3/02* | (2006.01) |
| *B22F 3/11* | (2006.01) |
| *C04B 35/115* | (2006.01) |
| *C04B 35/457* | (2006.01) |
| *C04B 35/486* | (2006.01) |
| *C04B 35/645* | (2006.01) |
| *H05B 3/60* | (2006.01) |

(52) U.S. Cl.
CPC ........... *C04B 35/111* (2013.01); *C04B 35/115* (2013.01); *C04B 35/457* (2013.01); *C04B 35/46* (2013.01); *C04B 35/4682* (2013.01); *C04B 35/486* (2013.01); *C04B 35/645* (2013.01); *C23C 16/32* (2013.01); *C23C 16/325* (2013.01); *H05B 3/60* (2013.01); *B22F 2003/1051* (2013.01); *B22F 2999/00* (2013.01); *C04B 2235/3208* (2013.01); *C04B 2235/3224* (2013.01); *C04B 2235/6583* (2013.01); *C04B 2235/6585* (2013.01); *C04B 2235/666* (2013.01)

(56) References Cited

U.S. PATENT DOCUMENTS

| | | |
|---|---|---|
| 3,241,956 A | 3/1996 | Inoue |
| 3,250,892 A | 5/1996 | Inoue |
| 2004/0028813 A1* | 2/2004 | Thebault ............... C23C 14/046 427/249.15 |
| 2009/0224434 A1 | 9/2009 | Anselmi-Tamburini et al. |
| 2012/0156479 A1* | 6/2012 | Nakamura ............. B82Y 30/00 428/336 |
| 2013/0082421 A1* | 4/2013 | Allemand ........... H01M 4/8889 264/414 |
| 2014/0287249 A1* | 9/2014 | Allemand ............... C04B 41/89 428/448 |
| 2015/0299052 A1 | 10/2015 | Allemand et al. |
| 2016/0040299 A1 | 2/2016 | Allemand et al. |
| 2018/0009669 A1 | 1/2018 | Allemand et al. |

FOREIGN PATENT DOCUMENTS

| | | | |
|---|---|---|---|
| JP | 06-345569 A | * | 12/1994 |
| JP | H09 157073 A | | 6/1997 |

OTHER PUBLICATIONS

Zgalat-Lozynskyy et al.: Spark plasma sintering of TiCN nanopowders in non-linear heating and loading regimes, J of the European Ceramic Society, 31, p. 809-813 (2011).*
Hong Peng, "Spark Plasma Sintering of Si3N4-based Ceramics", Doctoral Dissertation, Department of Inorganic Chemistry, Stockholm University, 2004, p. 12-13.*
International Search Report for International Application No. PCT/EP2016/076555, dated Feb. 2, 2017.
Preliminary French Search Report for Application No. FR 1560561, dated Jun. 21, 2016.
J. G. Noudem et al., "Thermoelectric properties of CA0.9Yb0.1MnO3-x prepared by spark plasma sintering in air atmosphere," Scripta Materialia 68 (2013) 949-952.
H. B. Zhang et al., "Optimization of high-pressure sintering of transparent zirconia with nano-sized grains", Journal of Alloys and Compounds 508 (2010) 196-199.
International Preliminary Report on Patentability for PCT/EP2016/076555, dated Sep. 29, 2017.
Wei, Xialu at al. "Spark Plasma Sintering of Commercial Zirconium Carbide Powders: Densification Behavior and Mechanical Properties" In: Materials, Sep. 10, 2015, vol. 8, pp. 6043-6061.

* cited by examiner

DIE AND PISTON OF AN SPS APPARATUS, SPS APPARATUS COMPRISING SAME, AND METHOD OF SINTERING, DENSIFICATION OR ASSEMBLY IN AN OXIDISING ATMOSPHERE USING SAID APPARATUS

This is a National Stage application of PCT international application PCT/EP2016/076555, filed on Nov. 3, 2016 which claims the priority of French Patent Application No. 15 60561, filed Nov. 4, 2015, both of which are incorporated herein by reference in its entirety.

TECHNICAL FIELD

The invention relates to a die and to a piston of a pulsed electric field hot sintering ("Spark Plasma Sintering" or SPS) apparatus that allow this apparatus to be used in an oxidising atmosphere, in particular in air and at a high temperature, for example greater than 700° C., and capable of reaching for example up to 1450° C.

The invention further relates to an SPS apparatus comprising this die and this piston, or more exactly to an SPS apparatus comprising a sintering, densification or assembly chamber consisting of said die and of two of said pistons.

Finally, the invention relates to a method for sintering, densifying or assembling by SPS in an oxidising atmosphere, in particular in air, and at a high temperature for example greater than 700° C., and capable of reaching up to 1450° C., that uses said apparatus.

The technical field of the invention may be defined in general as that of sintering, densification or assembly by the SPS technique.

PRIOR ART

The technology of pulsed electric field hot sintering, or sintering (or densification) under a pulsed electric current ("Spark Plasma Sintering" or "SPS") is also known by the English names "Field Activated Sintering" or FAS, "Field Activated Sintering Technique" or FAST, or "Pulsed Electric Current Sintering" or PECS.

The first patent applications [1], [2] relating to this technology were filed by K. INOUE at the end of the 1960s.

But it was only at the end of the 1990s that the number of patents and publications relating to the technique of "SPS" increased exponentially. In Europe, the number of "SPS" machines did not really increase until the beginning of the 2000s.

"SPS" is a sintering technique which consists in simultaneously applying on the solid, bulk, or powdered specimen to be densified, or on the parts to be assembled, a uniaxial pressure and pulses of high-intensity electric current that cause an increase in the temperature of the specimen.

The current is applied in the form of trains of pulses of current, for example having a period of 3.3 ms, the intensity of which may reach several thousand amperes, for example up to 8,000 A, or even 50,000 A.

The powders or parts may be made of metal, ceramic, or polymer materials.

The electric current is applied to the specimen via an arrangement, assembly, of plates or spacers and of pistons, generally made of graphite, the powder is inserted into a pelletizer, also called die or jacket, generally made of graphite, between two pistons.

Figure 1:
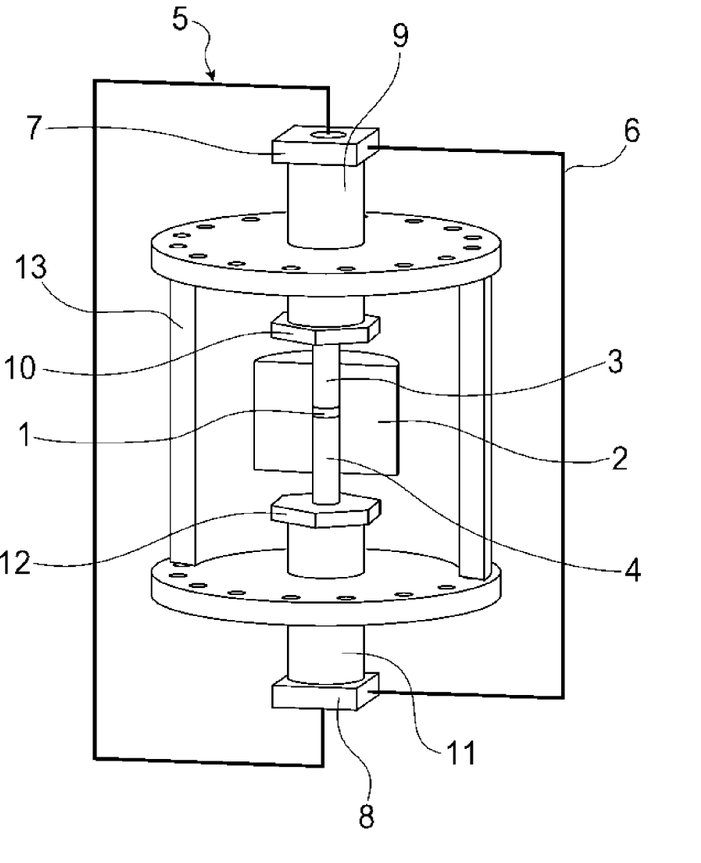
The single FIGURE is a schematic view of a vertical cross-section of an example of a conventional SPS apparatus, or of an example of an SPS apparatus according to the invention comprising a die and pistons according to the invention.

More precisely, the single FIGURE shows the operating principle of an SPS apparatus and of its main elements. The powder to be sintered is placed into a chamber (1) that is defined inside a die or jacket, for example made of graphite (2), between an upper piston ("punch") (3) and a lower piston (4). More precisely, the chamber (1) is in the die (2) between the upper end of the lower piston (4) and the lower end of the upper piston (3).

The pistons are generally made of graphite.

A pressure (5) is applied to these pistons (3, 4), and a direct current (6) is applied to an upper electrode (7) and lower electrode (8). The pressure and the current applied to the upper electrode (7) and to the lower electrode (8), respectively, are transmitted, respectively, to the upper piston (3) and to the lower piston (4) via upper (9, 10) and lower (11, 12) spacers, or plates, or discs, also generally made of graphite.

The powder (1), the pistons (3, 4), the die or jacket made of graphite (2) and a portion of the spacers (9, 11) are placed inside a vacuum chamber (13).

Instead of the powder to be sintered, a part, for example made of ceramic, to be densified, or two parts for example made of ceramic to be assembled may be placed in the chamber (1) between the two pistons (3, 4) in such a way as to have, in the die, the succession piston-$1^{st}$ part, for example made of ceramic-$2^{nd}$ part, for example made of ceramic-piston.

The arrangement, assembly, consisting of the pelletizer, die, the pistons and the spacers, plates is the only one, in the vacuum chamber, to experience a rise in temperature.

The temperature is generally monitored via an optical pyrometer that also controls the electric power injected into the assembly. As already mentioned above, the currents used during the sintering may reach up to 50,000 A.

The main advantage of the "SPS" technology is the possibility of densifying specimens, samples, even highly refractory, such as ceramics, in very short times of approximately several minutes, for example 5 to 10 minutes.

The sintering speed often allows the growth of grains to be minimised and, for certain materials, a density close to 100% to be reached.

Conventionally, SPS apparatuses operate under vacuum.

In these conventional vacuum assemblies, like the one shown in the single FIGURE, the use of dies and of pistons made of graphite (and also of spacers, plates, discs made of graphite) is particularly suitable.

There are also, however, works carried out in a neutral atmosphere. But in all cases, this leads to a very low oxygen partial pressure inside the chamber.

In all cases, the sintering thus takes place in a neutral atmosphere or under vacuum, otherwise, since the graphite oxidises at a low temperature (400° C.), the die, and the pistons would deteriorate very quickly.

However, there are numerous fields in which it would be very advantageous to carry out sintering by SPS in an oxidising atmosphere, in particular in air.

Thus, for example, sintering in air by SPS appears to be a densification technique likely to be an alternative to the densification techniques currently used (for example free sintering in air) for the densification of all oxide materials, for example such as $TiO_2$, $Al_2O_3$ or, for example, perovskite structures of $Ca_{0.9}Yb_{0.1}MnO_{3-x}$ type for the elaboration of thermoelectric materials [3].

Indeed, in a general way, the transport properties of oxides are highly dependent on the oxygen vacancies in their atomic structure.

Consequently, the control of these oxygen vacancies during sintering by SPS is crucial to the final properties of the material. By carrying out the sintering by SPS in an oxidising atmosphere, for example air in air, the reduction of the oxides would be avoided, and the oxygen vacancies would be well controlled. This confirms that it would be very advantageous to carry out sintering by SPS in an oxidising atmosphere, especially in air.

However, sintering by SPS in an oxidising atmosphere, in particular in air cannot be carried out in current, conventional SPS apparatuses, since these apparatuses comprise dies and pistons made of graphite that degrade very fast in an oxidising atmosphere and at relatively low temperatures, for example starting at 400° C. In other words, graphite is absolutely forbidden in SPS apparatuses operating in an oxidising atmosphere, in particular in air.

A single document, namely document [3], relates to the possibility of using the SPS technique in air and proposes, in order to constitute the die of the SPS apparatus, materials suitable for replacing graphite.

More precisely, document [3] examines the sintering of $Ca_{0.9}Yb_{0.1}MnO_{3-x}$ by the SPS technique and compares:

i) Sintering by the conventional SPS technique, that is to say, with an apparatus comprising a die made of graphite, sintering being carried out under vacuum at 900° C.;

ii) sintering by the SPS technique, with an apparatus comprising a die made of WC tungsten carbide, sintering being carried out in air at a temperature that may reach up to 600° C.;

iii) sintering by the SPS technique, with an apparatus comprising a mould made of a metal alloy (Inconel 718), sintering being carried out in air at a temperature that may reach up to 700° C.

It should be noted that the materials intended to form the dies of the SPS apparatuses must have three fundamental characteristics, namely: they must conduct the electric current, resist oxidation at the working temperature, for example up to 1450° C., and preserve good mechanical properties in order to transmit the pressure.

Out of the materials that constitute the dies of the SPS apparatuses in document [3], both WC tungsten carbide and Inconel 718 are conductive, but WC tungsten carbide oxidises very quickly starting at 500-600° C. which does not allow it to be used beyond this temperature, and Inconel 718 loses its mechanical properties beyond 600° C. Consequently, these materials could not be used for temperatures that exceed 700-800° C.

Document [4] describes a conventional tool apparatus that comprises a die and pistons made of monolithic SiC.

But, since monolithic SiC is only a semiconductor, it must compulsorily be lined with a chamber made of graphite in order to allow the pulses of current to pass through.

An apparatus thus designed, with therefore a lining made of graphite, allows higher pressures to be reached than the conventional apparatus disclosed in document [4]. However, it does not allow working in air because of the presence of the graphite.

Such an apparatus is currently marketed for use but only under vacuum or in a neutral gas at a higher pressure than conventional apparatuses.

From the above, it follows that there is a need for an SPS apparatus, and an SPS method using this apparatus, that allow powders or parts to be sintered, densified or assembled, in an oxidising atmosphere, in particular in an atmosphere of air, and at a high temperature, for example greater than or equal to 700° C. or 800° C., without the SPS apparatus and in particular the die and the pistons thereof being degraded or deteriorated even after several sintering, densification or assembly operations.

The goal of the present invention is, inter alia, to meet these needs.

The goal of the present invention is further to provide such an apparatus and such a method that do not have the drawbacks, defects, limitations and disadvantages of the methods and apparatuses of the prior art and that solve the problems of the methods and apparatuses of the prior art.

The goal of the present invention is also to overcome these disadvantages and to provide a solution to these problems by modifying a minimum number of elements in the existing SPS apparatuses.

DISCLOSURE OF THE INVENTION

This goal and others are reached according to the invention, first of all by providing a die of a spark plasma sintering apparatus (pulsed electric field hot sintering apparatus), characterised in that said die is made of graphite and the outer surfaces of said die are coated with a layer made of silicon carbide having a thickness of 1 to 10 µm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 µm.

In cases where the outer surfaces of the die are coated, in addition to the layer made of silicon carbide, by one or more other layers made of a carbide other than silicon carbide, the first layer that coats said outer surfaces, is always a layer made of SiC since this layer has the best properties of protecting against oxidation.

In other words, in cases where the outer surfaces of the die are coated with a plurality of layers, thus forming a multilayer coating, then the layer of this multilayer coating closest to said outer surfaces is a layer made of silicon carbide.

This goal and others yet are also reached according to the invention by providing a piston of a spark plasma sintering apparatus (pulsed electric field hot sintering apparatus), characterised in that said piston is made of graphite and the outer surfaces of said piston are coated with a layer made of silicon carbide having a thickness of 1 to 10 µm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 µm.

In cases where the outer surfaces of the piston are coated, in addition to the layer made of silicon carbide, by one or more other layer(s) made of a carbide other than silicon carbide, the first layer that coats said outer surfaces, is always a layer made of SiC since this layer has the best properties of protecting against oxidation.

In other words, in cases where the outer surfaces of the piston are coated with a plurality of layers, thus forming a multilayer coating, then the layer of this multilayer coating closest to said outer surfaces is a layer made of silicon carbide.

The die and the piston of an SPS spark plasma sintering apparatus (pulsed electric field hot sintering apparatus) according to the invention fundamentally differ from the dies and pistons of a conventional SPS spark plasma sintering apparatus (pulsed electric field hot sintering apparatus) of the prior art. Indeed, the dies and pistons of the prior art consist only of graphite, whereas the die and piston according to the invention are, of course, made of graphite, but the outer surfaces of said die and of said piston are coated with a layer made of silicon carbide having a specific thickness.

Moreover, said layer made of silicon carbide is optionally coated with one or more other layer(s) made of a carbide other than silicon carbide, chosen from hafnium carbide, tantalum carbide and titanium carbide, each of this or these other layer(s) also having a specific thickness.

A die and a piston of a spark plasma sintering apparatus (pulsed electric field hot sintering apparatus) made of graphite, the outer surfaces of which are coated with a layer made of silicon carbide having a specific thickness of 1 to 10 µm are neither described nor suggested in the prior art.

A fortiori, a die and a piston of a spark plasma sintering apparatus (pulsed electric field hot sintering apparatus) made of graphite, the outer surfaces of which are coated with a layer made of SiC silicon carbide having a specific thickness of 1 to 10 µm, said layer made of SiC being further coated with one or more other layer(s) made of a carbide other than silicon carbide, chosen from hafnium carbide, tantalum carbide and titanium carbide, each of this or these other layer(s) also having a specific thickness of 1 to 10 µm, are neither described nor suggested in the prior art.

The die and the piston according to the invention thus combine a core made of graphite with an envelope, surface layer made of SiC, said layer made of silicon carbide being further optionally coated with one or more other layer(s) made of a carbide other than silicon carbide Thus, in the die and the piston according to the invention, there are properties of protection against oxidation during operation of the SPS apparatus in an oxidising atmosphere, which are provided by the layer made of SiC, with which the outer surfaces of the part according to the invention are provided while preserving the conductive properties of graphite that are indispensable, essential, to the SiC.

In other words, the layer made of SiC constitutes a protective coating against oxidation (PAO) that protects the graphite during operation of the SPS apparatus in an oxidising atmosphere and surprisingly allows a die and pistons substantially consisting of graphite, with its indispensable, essential, electrically conductive properties, to be used, whereas this was absolutely forbidden in the prior art.

One prejudice is thus overcome by the die and the piston according to the invention.

Silicon carbide (SiC) is highly advantageous for forming PAOs, in particular PAOs that are resistant to high temperatures, for example greater than 800° C., since it forms, with the oxygen of the air, an oxide that, beyond 1300° C., has the lowest permeability to oxygen of all the oxides. Moreover, in certain temperature and $O_2$ partial pressure conditions, it forms a glassy phase that allows the pores and possible cracks to be plugged by coating the carbon.

According to the invention, the coating made of SiC on the parts made of graphite of an SPS apparatus that are the most stressed at a high temperature, that is to say, the die and the pistons surprisingly allows sintering to be carried out in an oxidising atmosphere, in particular in air without degradation of these parts and even at a high temperature greater than or equal to 700° C., which was not possible in the prior art.

The piston and the die according to the invention have the three fundamental characteristics mentioned above that these parts must have, namely: they conduct the electric current, they resist oxidation at the working temperature, for example above 700° C. and up to 1450° C., and they keep good mechanical properties in order to be able to transmit the pressure.

The piston and the die according to the invention can be easily, quickly and simply prepared at a low cost, indeed, for example it suffices to coat the conventional die and pistons made of graphite of a conventional apparatus with a layer made of SiC (said layer made of silicon carbide being further optionally coated with one or more other layer(s) made of a carbide other than silicon carbide) in order to obtain the piston and the die according to the invention.

Thus, with minimal, simple, quick and not costly changes, made to conventional pistons and dies made of graphite, and to the apparatus comprising them, considerable advantages are obtained during the implementation of the SPS method.

Advantageously, the outer surfaces of said die are coated with a layer made of silicon carbide by a "CVD" chemical vapour deposition method, and said layer made of silicon carbide is further optionally coated with one or more other layer(s) made of a carbide other than silicon carbide, chosen from hafnium carbide, tantalum carbide and titanium carbide, by a "CVD" chemical vapour deposition method.

Advantageously, the outer surfaces of said piston are coated with a layer made of silicon carbide by a "CVD" chemical vapour deposition method, and said layer made of silicon carbide is further optionally coated with one or more other layer(s) made of a carbide other than silicon carbide, chosen from hafnium carbide, tantalum carbide and titanium carbide, by a "CVD" chemical vapour deposition method.

The chemical vapour deposition method is preferred for depositing the layer made of silicon carbide and optionally the other layer(s) since it has the double advantage of being fast and not very costly.

The goal of the present invention and also others are then reached by providing an SPS spark plasma sintering apparatus (pulsed electric field hot sintering apparatus) comprising a die and two pistons, defining a sintering, densification or assembly chamber capable of receiving a powder to be sintered, a part to be densified, or parts to be assembled characterised in that said die is a die according to the invention as described above and said pistons are pistons according to the invention as described above.

The apparatus according to the invention differs from the apparatuses of the prior art only by the fact that it comprises the die and the pistons according to the invention, coated with a layer made of SiC (said layer made of silicon carbide being further optionally coated with one or more other layer(s) made of a carbide other than silicon carbide), instead of the conventional die and pistons, of the prior art, entirely made of graphite. The modification to be made to the existing apparatuses is therefore minimal and the replacement of the conventional die and pistons with the die and the pistons according to the invention may be done easily, simply, quickly, and at a low cost.

The apparatus according to the invention has all the surprising effects and advantages inherently caused by the die and the pistons according to the invention that this apparatus comprises. Most of these surprising effects and advantages have already been disclosed above.

The invention further relates to a method for sintering a powder, densifying a part, or assembling two parts by an SPS spark plasma sintering apparatus (pulsed electric field hot sintering method) in an oxidising atmosphere, characterised in that said method uses the SPS spark plasma sintering apparatus (pulsed electric field hot sintering apparatus) as described above.

The method according to the invention differs from the methods of the prior art in that said method uses the SPS spark plasma sintering apparatus (pulsed electric field hot sintering apparatus) according to the invention that comprises the die and the pistons according to the invention, coated with a layer made of SiC (said layer made of silicon carbide being further optionally coated with one or more other layer(s) made of a carbide other than silicon carbide), instead of the conventional die and pistons, of the prior art, entirely made of graphite.

The method according to the invention has all the surprising effects and advantages inherently caused by the use of the apparatus according to the invention, comprising, the die and the pistons according to the invention. Most of these surprising effects and advantages have already been disclosed above.

In particular, the method according to the invention due to the apparatus comprising the die and the pistons according to the invention that it uses allows, for the first time, the SPS method to be successfully implemented in an oxidising atmosphere such as air, at high temperatures that may reach for example up to 1450° C. This is demonstrated in the examples provided below.

With respect to a conventional SPS method using a conventional SPS apparatus with a die and pistons made of uncoated graphite, the parameters of the method are only slightly modified, whereas the advantages obtained are very significant.

Advantageously, the oxidising atmosphere is chosen from the atmospheres of gas containing oxygen, such as oxygen (pure), air, such as ambient air, and air enriched with oxygen.

This atmosphere is the one in the chamber (13) of the SPS apparatus as described above.

Since this chamber is no longer under vacuum, the apparatus is simplified and significant savings are also thus obtained.

Advantageously during the SPS spark plasma sintering apparatus (pulsed electric field hot sintering method), a sufficient pulsed electric current is applied to the powder, to the part or to the parts, in order to raise the temperature of the powder, of the part, or of the parts to a temperature at least equal to 700° C. or 800° C., preferably from 700° C. or 800° C. to 2500° C., more preferably from 700° C. or 800° C. to 1450° C., better from 900° C. to 1450° C., even better from 1100° C. to 1450° C.

Advantageously, after the sintering of the powder, the densification of the part, or the assembly of the two parts by the SPS spark plasma sintering apparatus (pulsed electric field hot sintering method), the sintered powder, the densified part or the assembly of the two parts is cooled, preferably to the ambient temperature, and the cooled sintered powder, the cooled densified part or the cooled assembly of the two parts is recovered.

The powder to be sintered, the part to be densified, or the parts to be assembled may be made of a material chosen from the metals, the alloys of metals, the oxides of metals or of metalloids, including the mixed oxides of metals or of metalloids, the carbides of metals or of metalloids, the nitrides of metals or of metalloids, and their mixtures.

Advantageously, the sintering of a powder of an oxide of a metal or of a metalloid or of a mixture of powders of oxides of a metal or of a metalloid may be carried out.

Advantageously, the oxide(s) of a metal or of a metalloid is(are) chosen from $TiO_2$, $Al_2O_3$, $BaTiO_3$, and the perovskites, for example having the formula $Ca_{0.9}Yb_{0.1}MnO_{3-x}$.

The sintering, the densification or the assembly in air has numerous advantages that have already been mentioned above.

Sintering in air allows the stoichiometry of oxygen of the sintered materials, in particular of the oxides, to be controlled. This allows control not only of their electric properties, but also of all their other properties, such as the magnetic, dielectric, properties etc.

Indeed, all these properties are dependent on this stoichiometry of oxygen.

The examples provided below that were carried out at temperatures of 900° C., 1100° C. and 1450° C. in air demonstrate that the method according to the invention was indeed successfully implemented.

Other features and advantages of the invention will become clear upon reading the detailed description below, this description being provided for illustrative purposes and being non-limiting, in relation to the appended drawing.

DETAILED DISCLOSURE OF SPECIFIC EMBODIMENTS

In the description below of the die, of the piston, of the apparatus and of the method according to the invention, reference is made to the single FIGURE.

The apparatus shown in the single FIGURE may be both a conventional apparatus comprising conventional die and pistons, for example made of graphite, and an apparatus according to the invention comprising a die and pistons according to the invention, the surfaces of which are coated with a layer made of silicon carbide (said layer made of silicon carbide being further optionally coated with one or more other layer(s) made of a carbide other than silicon carbide).

Indeed, according to the invention, it suffices simply, to replace the pistons and the die, generally made of graphite, of a conventional apparatus, such as an apparatus currently marketed, the die and the pistons according to the invention in order to obtain an apparatus according to the invention and all the advantageous effects of the invention. Such a change of die and of pistons is the change is fast, easy, and low-cost.

The modification thus made to a conventional apparatus in order to obtain an apparatus according to the invention is thus minimal and provides significant advantages.

The die and the pistons made of graphite of a conventional apparatus may even be removed, coated with a layer made of SiC, and optionally with one or more other layer(s) made of a carbide other than silicon carbide, and then placed again into the apparatus.

Moreover, the chamber (13) shown in the single FIGURE is not, in the case of an SPS apparatus according to the invention, placed under vacuum, but in an oxidising atmosphere, in particular in air, for example simply in ambient air.

First, a die (2) of a spark plasma sintering apparatus (pulsed electric field hot sintering apparatus) according to the invention will be described.

According to the invention, this die (2) is made of graphite and the outer surfaces of said die are coated with a layer made of silicon carbide having a thickness of 1 to 10 μm, said layer made of silicon carbide being optionally coated with one or more other layer(s) made of a carbide other than silicon carbide, chosen from hafnium carbide, tantalum carbide and titanium carbide, said other layer(s) each having a thickness of 1 to 10 μm.

This die (2) may also be called mould, jacket, die or pelletizer and generally has the shape of a hollow tube or cylinder such as that shown in the single FIGURE.

This die has the same shape and the same dimensions as a die of a conventional SPS apparatus, with the substantial difference, however, that according to the invention, the outer surfaces of said die are coated with a layer made of silicon carbide, and moreover optionally with one or more other layer(s) made of a carbide other than silicon carbide, chosen from hafnium carbide, tantalum carbide and titanium carbide, said other layer(s) each having a thickness of 1 to 10 µm.

Then, a piston of a spark plasma sintering apparatus (pulsed electric field hot sintering apparatus) according to the invention will be described. This piston may be either the upper piston (3) or the lower piston (4) shown in the single FIGURE.

According to the invention, this piston (3, 4) is made of graphite and the outer surfaces of said piston are coated with a homogenous layer made of silicon carbide having a thickness of 1 to 10 µm, said layer made of silicon carbide being optionally coated with one or more other layer(s) made of a carbide other than silicon carbide, chosen from hafnium carbide, tantalum carbide and titanium carbide, said other layer(s) each having a thickness of 1 to 10 µm.

This piston (3, 4) generally has the shape of a solid cylinder such as that shown in the single FIGURE.

This piston has the same shape and the same dimensions as a piston of a conventional SPS apparatus, with the substantial difference, however, that according to the invention, the outer surfaces of said piston are coated with a layer made of silicon carbide, said layer made of silicon carbide being optionally coated with one or more other layer(s) made of a carbide other than silicon carbide, chosen from hafnium carbide, tantalum carbide and titanium carbide.

According to the invention, the layer made of silicon carbide is a layer that may be qualified as a very fine or very thin layer. According to the invention, very fine or very thin layer generally means a layer having a thickness of 1 µm to 10 µm.

The layer made of silicon carbide may be deposited on the outer surfaces of the die and of the piston made of graphite by any suitable method known to the man skilled in the art.

Likewise, the other layer(s) made of a carbide other than silicon carbide, chosen from hafnium carbide, tantalum carbide and titanium carbide, may be deposited by any suitable method known to the man skilled in the art.

The die and the piston that are thus coated may be a conventional die and piston made of graphite, commercially available. As already mentioned above, for example the apparatuses and the pistons made of graphite of a conventional apparatus may be removed and coated with a layer made of SiC, said layer made of silicon carbide being optionally further coated with one or more other layer(s) made of a carbide other than silicon carbide, before being placed again into the apparatus.

A preferred method is the chemical vapour deposition method ("Chemical Vapour Deposition" or "CVD").

The man skilled in the art knows how to choose the parameters of the CVD method, namely, especially, the precursor, the deposition temperature, the gas flow rates (for example precursor and hydrogen), and the duration of the method in order to obtain, on a piston or a die made of graphite, a layer made of SiC having the desired thickness.

Likewise, the man skilled in the art knows how to choose the parameters of the CVD method, namely, especially, the precursor, the deposition temperature, the gas flow rates (for example precursor and hydrogen), and the duration of the method in order to obtain, on a piston or a die made of graphite, a layer made of HfC, TiC or TaC having the desired thickness.

The parameters of the chemical vapour deposition method, generally carried out in a CVD chemical vapour deposition furnace may, for example, be the following for the deposition of the layer made of SiC:

Precursor used: MTS (methyltrichlorosilane),
Temperature of the deposition: 900° C. to 1200° C., for example 975° C.;
Hydrogen flow rate: 300 to 600 sccm, for example 450 sccm ("standard cubic centimetres per minute");
Flow rate of MTS: 50 to 250 sccm, for example 150 sccm;
Duration of the treatment: 0.5 hours to 5 hours, for example 2.5 hours.
Thickness of the deposit: 1 to 10 µm.

The thickness of the deposit may be easily varied, for example by increasing the duration of the deposition at a given temperature.

The parameters of the chemical vapour deposition method that are given above are given for information purposes, as an example and are therefore absolutely not limiting.

An SPS spark plasma sintering apparatus (pulsed electric field hot sintering apparatus) according to the invention will now be described.

The SPS apparatus according to the invention comprises a die (2) and two pistons (3, 4), defining a sintering, densification or assembly chamber (1) capable of receiving a powder to be sintered, a part to be densified or parts to be assembled, said die (2) being a die according to the invention and said pistons (3, 4) being pistons according to the invention.

As indicated above, the description of an SPS apparatus already made above in relation to the appended single FIGURE also applies in its entirety to the apparatus according to the invention.

However, the apparatus according to the invention comprises a die and pistons according to the invention that are a die and pistons made of graphite, the outer surfaces of which are coated with a layer made of silicon carbide, optionally coated with one or more other layer(s) made of a carbide other than silicon carbide, and not conventional uncoated die and pistons made of graphite.

Optionally, in the apparatus according to the invention, the spacers, plates, discs, if they are made of graphite, may, just like the die and the pistons, be coated with a layer made of silicon carbide having a thickness of 1 to 10 µm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 µm.

However, it is less crucial to coat the plates spacers, discs with a layer made of silicon carbide and optionally with one or more other layer(s) made of a carbide other than silicon carbide since the temperature of the spacers, plates and discs rises less than the temperature of the die and of the pistons. Indeed, the temperature of the spacers, plates and discs only rises at most to approximately 300° C. to 400° C., a temperature at which graphite does not oxidise.

Moreover, as specified above, the chamber (13) shown in the single FIGURE, is not compulsorily, in the case of an SPS apparatus according to the invention, placed under vacuum.

The method according to the invention for sintering a powder, densifying a part, or assembling two parts by an SPS spark plasma sintering apparatus (pulsed electric field hot sintering method) that, uses the apparatus according to the invention will now be described.

The description below is given in relation to the sintering of a powder or of a mixture of powders, but it could apply, with some adaptations within the reach of the man skilled in the art to the densification of a part, or to the assembly of two parts.

The powder or the powders to be sintered, may be made of a material chosen from metals, alloys of metals, oxides of metals or of metalloids, including the mixed oxides of metals or of metalloids, carbides of metals or of metalloids, and nitrides of metals or of metalloids.

Advantageously, the sintering of a powder of an oxide of a metal or of a metalloid or of a mixture of powders of oxides of a metal or of a metalloid may be carried out.

Advantageously, the oxide(s) of a metal or of a metalloid is(are) chosen from $TiO_2$, $Al_2O_3$, $BaTiO_3$, and perovskites, for example having the formula $Ca_{0.9}Yb_{0.1}MnO_{3-x}$.

First, in general, the powder or the mixture of powders is placed inside the mould, the pelletiser, jacket, die made of graphite coated with SiC of the "SPS" apparatus, machine, device, according to the invention, described above.

In general, a sheet of flexible graphite such as the product marketed under the brand name PAPYEX® by the company Carbone Lorraine is placed between the powder or the mixture of powders and the inner walls of the mould and between the powder or the mixture of powders and the pistons. The goal of this sheet is to prevent the powder(s) from reacting with the mould and the pistons and to protect them.

The PAPYEX® may be coated on one of its faces, namely the face in contact with the powder or the mixture of powders, with a layer of BN boron nitride.

The BN acts as a diffusion barrier between the powder(s) and the graphite.

According to the invention, the sheet of flexible graphite, PAPYEX® may be omitted, since the SiC with which the die and the pistons are coated, also allows the diffusion of the carbon from the die and from the pistons to the material to be sintered to be blocked. This is an additional advantage provided by the die and the pistons according to the invention with respect to the die and pistons of the prior art made of pure graphite, not coated with SiC.

The mould made of graphite coated with SiC may also be coated with a felt made of graphite in order to limit radiation.

The pelletiser, die, jacket, mould and the pistons are then placed in the SPS machine such as the machine described in the single FIGURE.

According to the invention, the chamber (13) is not placed under vacuum, but is placed in an oxidising atmosphere.

This atmosphere may be in particular an atmosphere of oxygen (pure), of air or of air enriched with oxygen.

The chamber (13) may simply remain in ambient air.

It should be noted that in the method according to the invention that uses the SPS apparatus according to the invention, few parameters out of the parameters that control the sintering, densification or assembly method, are modified with respect to a conventional method using a conventional SPS apparatus with a die and pistons not coated with a layer made of SiC. The fundamental difference between a conventional method and the method according to the invention is that in the latter, because of the specific apparatus that it implements, the sintering is carried out in an oxidising atmosphere.

Then, a sufficient pressure is applied to said mixture of powders and simultaneously, a sufficient pulsed electric current is applied to the powder or to the mixture of powders in order to raise the temperature of the powder or of the mixture of powders to a temperature sufficient for causing sintering of the powder or of the mixture of powders.

In other words, when everything is in contact (die, pistons, mixture), an electric current may be generated in order to create the rise in temperature. In general, the maximum amperage that a die can resist is related in particular to its diameter. Thus, for a specimen diameter of 8 mm, 2000 A may be applied without the risk of degrading the die. For greater diameters such as 20 mm, 4000 A or more can be applied.

The pulsed electric current applied is generally from 1 A to 50,000 A in order to create a rise in temperature up to a temperature (plateau temperature) generally at least equal to 700° C. or 800° C., preferably from 700° C. or 800° C. to 2500° C., more preferably from 700° C. or 800° C. to 1450° C., better from 900° C. to 1450° C., even better from 1100° C. to 1450° C., for example 900° C., 1100° C. or 1450° C.

The pressure that is applied at the same time corresponds to an applied force of 0.01 MPa to 500 MPa.

Preferably, the pressure applied is, according to the invention, generally from 1 to 200 MPa and the intensity applied is preferably from 500 to 8,000 A. Preferably, the pressure is from 10 to 150 MPa, more preferably from 20 to 100 MPa, for example 40 MPa.

Preferably, the intensity is from 200 to 6,000 A, more preferably from 300 to 1000 A.

The values for pressure and intensity are chosen within the above ranges in such a way that the temperature of the powder or of the mixture of powders rises to a temperature (plateau temperature) allowing the sintering of the powder or of the mixture of powders.

Such a temperature is at least equal to 700° C. or 800° C., preferably from 700° C. or 800° C. to 2500° C., more preferably from 700° C. or 800° C. to 1450° C., better from 900° C. to 1450° C., even better from 1100° C. to 1450° C., for example 900° C., 1100° C. or 1450° C.

The time for which said temperature (also called plateau temperature) for example of 1450° C. is maintained, a time that can be also called plateau duration or time is a short time generally from 0 to 10 minutes, preferably from 0 to 7 minutes, for example 3 or 5 minutes.

When the plateau time is equal to 0, this means that the temperature is raised up to the maximum temperature and that the temperature is lowered to the ambient temperature without a plateau being observed.

It should be noted that this plateau time is in all cases very low, with respect to the other sintering methods.

Likewise, the cycle time outside of cooling, and the overall, total duration of the complete cycle with cooling, are reduced.

This cycle time is for example 10 to 30 minutes, in particular from 20 to 22 minutes only, and the duration of the complete cycle is approximately one hour, which is another advantage of the method according to the invention.

It is generally important to control the discount in temperature and pressure in order to prevent cracking of the material namely of the sintered powder.

The cooling of the material is generally carried out in a way that is not too sudden, as the man skilled in the art in this technical field can understand. Thus, in general, a cooling speed of 1° C. to 600° C. per minute, for example from 10° C. to 100° C./min from the temperature plateau is observed.

The cooling may be carried out with a single ramp according to the thermal inertia of the machine from the plateau temperature to the ambient temperature.

Or, preferably, the cooling is carried out by successive temperature ramps having different slopes, thus the cooling may be carried out for example as follows: 45° C./min from the plateau temperature to 600° C.; then cooling according to the thermal inertia of the machine from 600° C. to the ambient temperature.

It is obvious to the man skilled in the art that the temperature-pressure cycle should be optimised for each type of powder or mixture of powders of precursors, implemented.

However, regardless of the rises, the descents or the durations of the temperature and pressure plateaus, the simultaneity (of the variations) in the temperature and in the pressure is indispensable, essential, for good sintering of the powder or of the mixture of powders.

Advantageously, the temperature parameters and thus the intensity parameters, and the pressure (or applied force, the pressure being dependent on the bearing surface according to the well-known relationship P=F/S) parameters are not, starting from the ambient temperature and a pressure of 0 MPa, applied suddenly, instantaneously, but are raised progressively from the ambient temperature (generally 20° C. to 25° C.) and a pressure of 0 MPa.

For the temperature (controlled by the intensity), a progressive rise with a ramp, or a plurality of ramps optionally having different slopes, is thus preferably carried out, these ramps being optionally separated by intermediate plateaus, in order to arrive at the maximum temperature mentioned above, also called plateau temperature or sintering temperature.

Said temperature ramp(s) preferably have a slope from 50° C. to 200° C./min, for example 80° C./min. or 100° C./min.

Overall, in order to reach the maximum temperature, for example 900° C., 1100° C. or 1400° C., the rise in temperature of the ramps is preferably adjusted to be as close as possible to a ramp of 80° C./minute or 100° C./minute.

According to the invention, during the sintering, a first plateau at a first temperature and then a second plateau or final plateau at the maximum temperature or sintering temperature may thus be observed.

The first plateau may be carried out at a temperature of 600° C., at 800° C., for example of 600° C., for a time of 1 to 5 minutes, for example 3 minutes;

The second plateau may be created at a temperature of 900° C. to 1450° C., for example of 1100° C., for a time from 0 to 20 minutes, for example 5 minutes.

Likewise, for the pressure, a progressive rise with a ramp, or a plurality of ramps optionally having different slopes, may thus be advantageously carried out, these ramps being optionally separated by intermediate plateaus, in order to arrive at the maximum pressure indicated above, also called plateau pressure or sintering pressure.

Said pressure ramp(s) generally have a slope of 1 MPa/min to 40 MPa/min, preferably 40 MPa/min.

The rise in temperature and the rise in pressure whether progressive or not, are preferably carried out simultaneously, concomitantly, over the same duration.

If a plurality of pressure ramps and a plurality of temperature ramps are carried out, corresponding pressure and temperature ramps preferably have the same duration.

By applying the temperature (and thus intensity) parameters and/or the pressure (and thus the applied force) parameters progressively and not abruptly, suddenly, instantaneously, the material is not subjected to stresses that are too great and no breaking of the material occurs.

For example, a rise in temperature, from the ambient temperature (generally 20° C. to 25° C.), to 1450° C., may be carried out in the following manner:
  from the ambient temperature to 600° C.: approximately 4 minutes;
  plateau at 600° C.: approximately 1 minutes;
  from 600° C. to 1450° C.: approximately 8 minutes;
  plateau at 1450° C.: approximately 5 minutes;
  cooling from 1450° C. to the ambient temperature: time dependent on the thermal inertia of the machine, for example from 10 minutes to 30 minutes, in particular 20 minutes.

At the same time, the pressure changes in the following manner:
  from 0 to 40 MPa, from the time 0 (moment at which the heating begins starting at the ambient temperature, that is to say, beginning of the first temperature ramp): approximately 1 minute.
  plateau at 40 MPa: approximately 21 minutes.
  from 40 MPa to 0 MPa: approximately 2 minutes.

The current is applied in the form of series, trains of pulses; each series, train, consists of a fixed and adjustable number of "pulses". The series (trains) are separated from each other by a time during which the applied current is zero.

In the method according to the invention, pulses from 1 to 5 ms are generally used, for example having a period of 3.3 ms, generally assembled into trains of 1 to 15, for example 12 pulses, each train generally being separated by 1 to 15 periods, for example 2 periods, of the above duration (such as 3.3 ms), without current.

It is possible to change these values, but the current must always keep the same geometry, namely: more or less numerous trains of pulses separated by variable periods without current.

The voltage applied is of several volts, generally from 1 to 8 volts, preferably from 2 to 7 volts, typically 3 volts at 500 A.

After the cooling, generally to the ambient temperature, for example from 20° C. to 25° C., the material, namely the sintered powder, prepared by the method according to the invention in the "SPS" apparatus, is recovered.

An analogous description could be made for the densification of a part or the assembly of two parts by the method according to the invention.

The invention will now be described in reference to the following examples, given for information purposes and not limiting.

EXAMPLES

In example 1, dies and pistons of an SPS apparatus according to the invention are manufactured, that is to say, dies and pistons having outer surfaces coated with a layer made of SiC silicon carbide, having a thickness of 1 to 10 µm.

In examples 2, 3 and 4, the sintering is carried out by SPS in air, respectively at 900° C., 1100° C. and 1450° C., respectively of a powder of $TiO_2$, of a powder of $BaTiO_3$, and of a powder of $Al_2O_3$, using an SPS apparatus fitted with the die and pistons coated with a layer made of SiC manufactured in example 1.

Example 1

In this example 1, a die and two pistons of an SPS apparatus according to the invention are manufactured, that is to say, dies and pistons having outer surfaces coated with a layer made of SiC silicon carbide, having a thickness of 1 to 10 μm.

To this end, in a CVD chemical vapour deposition furnace, the dies and the pistons made of graphite of an SPS apparatus like the one in the single FIGURE are treated in order to coat the outer surfaces of these dies and pistons made of graphite with a layer made of SiC silicon carbide.

The SPS apparatus is an SPS-Dr Sinter® apparatus available from the company SPS Syntex Inc®.

The pistons and the die of the apparatus are removed and they are coated by CVD.

The parameters of the chemical vapour deposition treatments are the following:
the precursor used is MTS (methyltrichlorosilane),
the temperature of the deposition is 975° C.;
the flow rate of hydrogen is 450 sccm ("standard cubic centimetres per minute");
the flow rate of MTS is 150 sccm;
the duration of the treatment is 2.5 hours;
the thickness of the deposit is from 1 to 10 μm;

The thickness of the deposit can be easily varied, for example by increasing the duration of the deposition at the given temperature.

A plurality of dies and pistons, the outer surfaces of which are coated with a layer made of SiC silicon carbide, having a thickness of 1 to 10 μm, are thus manufactured.

The dies and pistons made of graphite thus treated, the outer surfaces of which are coated with a layer made of SiC silicon carbide, can then be used in the SPS apparatus in the same way as the uncoated dies and pistons made of graphite.

Example 2

In this example, the sintering of a powder of $TiO_2$ is carried out by SPS in air.

The SPS apparatus is a DR. SINTER® SPS apparatus available from the company SPS Syntex Inc® that is fitted with an assembly consisting of a die and of pistons made of graphite, coated with a layer made of SiC as described in example 1.

The die is surrounded by a jacket made of carbon felt.

The parameters of the sintering by SPS in air are the following:
Pulses:
Pulses having a period of 3.3 ms;
Trains of 12 pulses, separated by 2 periods without current having the above duration ("12 ON and 2 OFF");
Voltage applied: up to 10V.
Temperature Cycle:
Rise from the ambient temperature to 900° C.: 9 minutes;
Plateau at 900° C.: 3 minutes;
Cooling from 900° C. to the ambient temperature: time dependent on the thermal inertia of the machine.
Pressure Cycle:
Simultaneously to the temperature cycle, the pressure cycle was the following:
Rise from 0 to 40 MPa (for an applied force of 3.1 kN on the surface of the die having a diameter of 10 mm): 1 minute;
Plateau at 40 MPa (3.1 kN): 11 minutes;
Decrease in the pressure from 40 MPa (3.1 kN) to 0 MPa (0 kN): 1 minute.

With respect to a conventional SPS cycle, in this example, according to the invention, a vacuum was not created in the chamber of the SPS apparatus. For the entire duration of the experiment, the chamber thus remained in ambient air.

By visually comparing the state of the pistons and of the die before, and after the sintering by SPS in air, it is possible to note that none of these elements were damaged. The assembly consisting of the die and the pistons can indeed be reused.

Example 3

In this example, the sintering of a powder of $BaTiO_3$ is carried out by SPS in air.

The SPS apparatus is a DR. SINTER® SPS apparatus available from the company SPS Syntex Inc® that is fitted with an assembly consisting of a die and of pistons made of graphite, coated with a layer made of SiC as described in example 1.

The die is surrounded by a jacket made of carbon felt.

The parameters of the sintering by SPS in air are the following:
Pulses:
Pulses having a period of 3.3 ms;
Trains of 12 pulses, separated by 2 periods without current having the above duration ("12 ON and 2 OFF");
Voltage applied: up to 10 V.
Temperature Cycle:
Rise from the ambient temperature to 1100° C.: 11 minutes;
Plateau at 1100° C.: 5 minutes;
Cooling from 1100° C. to the ambient temperature: time dependent on the thermal inertia of the machine.
Pressure Cycle:
Simultaneously to the temperature cycle, the pressure cycle was the following:
Rise from 0 to 40 MPa (for an applied force of 3.1 kN on the surface of the die having a diameter of 10 mm): 1 minute;
Plateau at 40 MPa (3.1 kN): 15 minutes;
Decrease in the pressure from 40 MPa (3.1 kN) to 0 MPa (0 kN): 1 minute.

With respect to a conventional SPS cycle, in this example, according to the invention, a vacuum was not created in the chamber of the SPS apparatus.

For the entire duration of the experiment, the chamber thus remained in ambient air, like in example 2.

By visually comparing the state of the pistons and of the die before, and after the sintering by SPS in air, it is possible to note that none of these elements were damaged, like in example 2.

The assembly consisting of the die and the pistons can indeed be reused.

Example 4

In this example, the sintering of a powder of $Al_2O_3$ is carried out by SPS in air.

The SPS apparatus is a DR. SINTER® SPS apparatus available from the company SPS Syntex Inc® that is fitted with an assembly consisting of a die and of pistons made of graphite, coated with a layer made of SiC as described in example 1.

The die is surrounded by a jacket made of carbon felt.

The parameters of the sintering by SPS in air are the following:
Pulses:
Pulses having a period of 3.3 ms;

Trains of 12 pulses, separated by 2 periods without current having the above duration ("12 ON and 2 OFF");
Voltage applied: up to 10 V.
Temperature Cycle:
Rise from the ambient temperature to 600° C.: 4 minutes;
Plateau at 600° C.: 3 minutes;
Rise from 600° C. to 1450° C.: 8 minutes;
Plateau at 1450° C.: 5 minutes;
Cooling from 1450° C. to the ambient temperature: time dependent on the thermal inertia of the machine.
Pressure Cycle:
Simultaneously to the temperature cycle, the pressure cycle was the following:
Rise from 0 to 40 MPa (for an applied force of 3.1 kN on the surface of the die having a diameter of 10 mm): 1 minute;
Plateau at 40 MPa (3.1 kN): 21 minutes;
Decrease in the pressure from 40 MPa (3.1 kN) to 0 MPa (0 kN): 1 minute.

With respect to a conventional SPS cycle, in this example, according to the invention, a vacuum was not created in the chamber of the SPS apparatus.

For the entire duration of the experiment, the chamber thus remained in ambient air, like in examples 2 and 3.

Like in the previous two experiments, the die is surrounded by a carbon felt.

This felt is totally consumed during the experiment.

The visual observation of the assembly of the chamber (assembly of the chamber means the chamber consisting of the die and the pistons) of the SPS apparatus during sintering in air at the end of the plateau at 1450° C. shows a piston and die assembly strongly radiating at 1450° C. The felt being consumed is only held by braids of carbon.

The visual observation of the die after the sintering allows it to be noted that is has a blueish appearance and that pinholes have appeared at the edges. Only the felt made of carbon that surrounded the mould, which was not coated with SiC, disappeared.

This demonstrates the benefit provided by the coating made of SiC according to the invention on the mould and the two pistons.

The alumina obtained after the sintering is translucent, which is proof of almost total densification.

REFERENCES

[1] U.S. Pat. No. 3,241,956.
[2] U.S. Pat. No. 3,250,892.
[3] J. G. Noudem, S. Quetel-Weben, R. Retoux, G. Chevalier, C. Estrournes, *Scripta Materialia* 68 (2013) 949-952.
[4] H. B. Zhang, B. N. Kim, K. Morita, H. Yoshida, J. H. Lim, K. Hiraga, *Journal of Alloys and Compounds* 508 (2010) 196-199.

The invention claimed is:

1. A conventional spark plasma sintering apparatus comprising a conventional die and two conventional pistons, defining a sintering, densification or assembly chamber capable of receiving a powder to be sintered, a part to be densified, or parts to be assembled, wherein said conventional die has been replaced with a coated die, wherein said coated die is made of graphite and the outer surface of said coated die is coated with a homogenous layer made of silicon carbide having a thickness of 1 to 10 μm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 μm, and wherein said die is configured to conduct a pulsed current from 200 to 6000 A and/or a voltage of 1 to 8 volts and wherein said die is further configured to resist degradation at temperatures of between 700° C. and 1450° C.

2. A conventional spark plasma sintering apparatus comprising a conventional die and two conventional pistons, defining a sintering, densification or assembly chamber capable of receiving a powder to be sintered, a part to be densified, or parts to be assembled, wherein both of said conventional pistons have been replaced with coated pistons, wherein each of said coated pistons is made of graphite and the outer surfaces of each of said coated pistons are coated with a homogenous layer made of silicon carbide having a thickness of 1 to 10 μm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 μm, and wherein each of said coated pistons are configured to conduct a pulsed current from 200 to 6000 A and/or a voltage of 1 to 8 volts and wherein said coated pistons are further configured to resist degradation at temperatures of between 700° C. and 1450° C.

3. The spark plasma sintering apparatus according to claim 1, wherein the outer surfaces of said coated die are coated with a layer made of silicon carbide by a "CVD" chemical vapour deposition method, and said layer made of silicon carbide is further optionally coated with one or more other layer(s) made of a carbide other than silicon carbide, chosen from hafnium carbide, tantalum carbide and titanium carbide, by a "CVD" chemical vapour deposition method.

4. The spark plasma sintering apparatus according to claim 2, in which the outer surfaces of each of said coated pistons are coated with a layer made of silicon carbide by a "CVD" chemical vapour deposition method, and said layer made of silicon carbide is further optionally coated with one or more other layer(s) made of a carbide other than silicon carbide, chosen from hafnium carbide, tantalum carbide and titanium carbide, by a "CVD" chemical vapour deposition method.

5. The spark plasma sintering apparatus according to claim 1 further comprising replacement of said conventional pistons with coated pistons, wherein each of said coated pistons is made of graphite and the outer surfaces of each of said coated pistons are coated with a layer made of silicon carbide having a thickness of 1 to 10 μm, said layer made of silicon carbide being further optionally coated with one or more other layer(s) made of a carbide other than silicon carbide, chosen from hafnium carbide, tantalum carbide and titanium carbide, said other layer(s) each having a thickness of 1 to 10 μm.

6. The spark plasma sintering apparatus according to claim 1, further comprising a flexible graphite sheet placed within said sintering, densification or assembly chamber such that, when said powder is received therein, the flexible graphite sheet is between said powder and inner walls of said sintering, densification or assembly chamber, wherein said flexible graphite sheet is coated with a layer of boron nitride on a face thereof.

7. The spark plasma sintering apparatus according to claim 5, wherein the two coated pistons comprise an upper piston and a lower piston, further comprising an upper electrode, a lower electrode, and a vacuum chamber, said vacuum chamber enclosing said die, said upper piston, and said lower piston, said upper electrode electrically conducted to said upper piston via upper spacers, plates or discs, said lower electrode electrically conducted to said lower piston via lower spacers, plates or discs.

8. The spark plasma sintering apparatus according to claim 7, further comprising a flexible graphite sheet placed within said sintering, densification or assembly chamber such that, when said powder is received therein, the flexible graphite sheet is between said powder and inner walls of said sintering, densification or assembly chamber, wherein said flexible graphite sheet is coated with a layer of boron nitride on a face thereof.

* * * * *